United States Patent
Pei

(10) Patent No.: US 7,970,360 B2
(45) Date of Patent: Jun. 28, 2011

(54) ELECTRONIC DEVICE WITH A DISTORTION CORRECTION CIRCUIT FOR A POWER AMPLIFIER, AND ASSOCIATED METHODS

(75) Inventor: Alexander X. Pei, Fairport, NY (US)

(73) Assignee: Harris Corporation, Melbourne, FL (US)

( * ) Notice: Subject to any disclaimer, the term of this patent is extended or adjusted under 35 U.S.C. 154(b) by 484 days.

(21) Appl. No.: 12/257,490

(22) Filed: Oct. 24, 2008

(65) Prior Publication Data

US 2010/0105342 A1    Apr. 29, 2010

(51) Int. Cl.
*H04B 1/04*    (2006.01)
(52) U.S. Cl. ........... 455/114.3; 455/73; 455/76; 455/91; 375/296; 375/297
(58) Field of Classification Search ............... 455/114.3, 455/73, 76, 91, 102; 375/296, 297
See application file for complete search history.

(56) References Cited

U.S. PATENT DOCUMENTS

| | | | |
|---|---|---|---|
| 5,770,971 A | 6/1998 | McNicol | 330/52 |
| 5,796,309 A | 8/1998 | Nguyen | 330/289 |
| 6,670,849 B1 | 12/2003 | Damgaard et al. | 330/129 |
| 6,711,217 B1 | 3/2004 | Jeong | 375/297 |
| 6,792,282 B1 | 9/2004 | Domino et al. | 455/522 |
| 6,928,272 B2 | 8/2005 | Doi | 455/114.2 |
| 7,113,036 B2 | 9/2006 | Moffatt et al. | 330/149 |
| 7,215,716 B1 | 5/2007 | Smith | 375/296 |
| 7,333,559 B2 | 2/2008 | Song et al. | 375/296 |
| 7,369,871 B2 | 5/2008 | Vakilian et al. | 455/522 |
| 2005/0243946 A1 | 11/2005 | Chung et al. | 375/297 |
| 2007/0281652 A1* | 12/2007 | Tanaka et al. | 455/260 |
| 2008/0003962 A1* | 1/2008 | Ngai | 455/179.1 |
| 2010/0311365 A1* | 12/2010 | Vinayak et al. | 455/127.1 |

* cited by examiner

*Primary Examiner* — Tuan A Pham
(74) *Attorney, Agent, or Firm* — Allen, Dyer, Doppelt, Milbrath & Gilchrist, P.A.

(57) ABSTRACT

An electronic device includes a radio frequency (RF) modulator, a power amplifier, and a distortion correction circuit coupled between the RF modulator and the power amplifier. The distortion correction circuit includes a variable gain amplifier coupled between the RF modulator and the power amplifier, and an amplitude correction control loop. The amplitude correction control loop includes a first logarithmic converter having an input coupled to the RF modulator, a second logarithmic converter having an input coupled to an output of the power amplifier, and a difference circuit coupled to outputs of the first and second logarithmic converters for controlling the gain of the variable gain amplifier for correcting distortion in an output signal from the power amplifier.

23 Claims, 5 Drawing Sheets

ELECTRONIC DEVICE WITH A DISTORTION CORRECTION CIRCUIT FOR A POWER AMPLIFIER, AND ASSOCIATED METHODS

FIELD OF THE INVENTION

The present invention relates to the field of radio frequency (RF) communications, and more particularly, to correcting distortion in an output signal from a power amplifier of an RF transmitter.

BACKGROUND OF THE INVENTION

A power amplifier in an RF transmitter operating at high power levels has non-linear amplifier characteristics that can produce undesired intermodulation distortion due to interaction between the signals being amplified. Often referred to as a non-linear device, a power amplifier has linear regions and non-linear regions. To avoid signal distortion, a power amplifier needs to be used in the linear regions.

In the non-linear regions, signals from the power amplifier will be subject to amplitude to amplitude modulation. This is caused by the fact that as the power amplifier is operated in the non-linear regions, the ratios of input to output power are not constant. As the input signal amplitude increases, there will be a disproportionate increase in the output power. This is called amplitude modulation/amplitude modulation (AM/AM) since an unwanted additional amplitude modulation is experienced.

As an example, AM/AM distortion will be experienced up to the maximum output power at which point all input values will have the same output value. This is called compression and will result in the signal being clipped. This will result in the signal having square or sharper edges in the time domain which means that higher frequency components will be generated and side lobe re-growth in the frequency domain will be experienced. This can and often does cause out of band emissions in addition to distorting the amplified signal.

Envelope feedback is often used for correcting distortion in an output signal from a power amplifier. However, traditional envelope feedback's strength or gain depends on the waveform envelope. This makes it difficult to maintain a consistently strong feedback. As waveforms move to higher peak-to-average ratios with higher symbol rates, the envelope gain dependence often results in insufficient distortion correction.

One approach for correcting distortion in an output signal from a power amplifier is disclosed in U.S. Pat. No. 6,711,217. A baseband linearization arrangement receives the baseband signal, demodulates a distorted amplifier output signal, and compares the received baseband signal with the demodulated amplification output signal for providing a predistorted signal to remove the distorted component of the amplifier output signal applied by the power amplifier. A carrier band linearization amplification arrangement amplifies the output signal of the baseband linearization arrangement to linearize the distorted component of the amplifier output signal using the predistorted signal. The distorted component from the output of the power amplifier is linearized by extracting an error signal and amplifying the error signal to be combined with the amplifier output signal to eliminate any distorted components in the amplifier output signal.

Another approach for correcting distortion in an output signal from a power amplifier is disclosed in U.S. Pat. No. 7,215,716. Pre-distortion signals are generated such that when these signals are amplified, the non-linear distortions of the power amplifier are opposite that of the pre-distortion. This is based on using a predistortion look up (LUT).

SUMMARY OF THE INVENTION

In view of the foregoing background, it is therefore an object of the present invention to correct distortion in an output signal from a power amplifier of an RF transmitter such as without relying on envelope feedback schemes whose effectiveness depends on the waveform envelope of the amplified signal.

This and other objects, features, and advantages in accordance with the present invention are provided by an electronic device comprising an RF modulator, a power amplifier, and a distortion correction circuit coupled between the RF modulator and the power amplifier. The distortion correction circuit may comprise a variable gain amplifier coupled between the RF modulator and the power amplifier, and an amplitude correction control loop. The amplitude correction control loop may comprise a first logarithmic converter having an input coupled to the RF modulator, a second logarithmic converter having an input coupled to an output of the power amplifier, and a difference circuit coupled to outputs of the first and second logarithmic converters for controlling the gain of the variable gain amplifier for correcting distortion in an output signal from the power amplifier.

The first and second logarithmic converters may advantageously correct non-linearity in the amplitude of the output signal from the power amplifier without being dependent on the envelope of the output signal. The first and second logarithmic converters may be matched over an operating temperature range associated with the electronic device.

The amplitude correction control loop may further comprise an offsetting circuit coupled to an output of the difference circuit for offsetting an output signal therefrom based on a power preset signal. The amplitude correction control loop may further comprise an error integrator coupled to an output of the offsetting circuit for integrating an offset output signal therefrom, with the integrated offset output signal being used for controlling the gain of the variable gain amplifier.

By varying the offset to the error integrator, a variable ratio may be achieved between an instant amplitude of the output signal from the power amplifier and that of the reference signal from the signal source. This may advantageously correct non-linearity in the amplitude of the output signal from the power amplifier by removing the feedback gain dependence on the envelope of the output signal from the power amplifier. Further, a consistently high feedback gain may be maintained regardless of a value of the signal envelope and precise automatic transmit gain control (TGC) is simultaneously achieved. Since the power amplifier is allowed to operate in a more non-linear mode, it is more efficient, particularly in terms of power consumption and heat generation.

The distortion correction circuit may further comprise a reflected power protection control loop for protecting the power amplifier under high VSWR conditions. The reflected power protection control loop may be selectively coupled to the variable gain amplifier via a switch when the VSWR is high for controlling the gain of the variable gain amplifier. An advantage of the reflected power protection control loop is that under high VSWR conditions, this control loop may pre-empt the amplitude correction control loop. The reflected power protection control loop may include third and fourth logarithmic converters, similar to the first and second logarithmic converters in the amplitude correction control loop.

The RF modulator may operate based on quadrature amplitude modulation (QAM). The output signal from the power amplifier may be within a frequency range of 3 MHz to 3 GHz, for example.

Another aspect of the present invention is directed to a distortion correction circuit to be coupled between a signal source and a power amplifier of an RF transmitter. The distortion correction circuit may be as defined above.

Yet another aspect of the present invention is directed to a method for correcting distortion in an output signal from a power amplifier of an RF transmitter using a distortion correction circuit as defined above. The method comprises using the first logarithmic converter for converting a signal from the signal source to a first logarithmic signal, using the second logarithmic converter for converting the output signal from the power amplifier to a second logarithmic signal, and using the difference circuit for determining a difference between the first and second logarithmic signals for controlling the gain of the variable gain amplifier for correcting the distortion in the output signal from the power amplifier.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
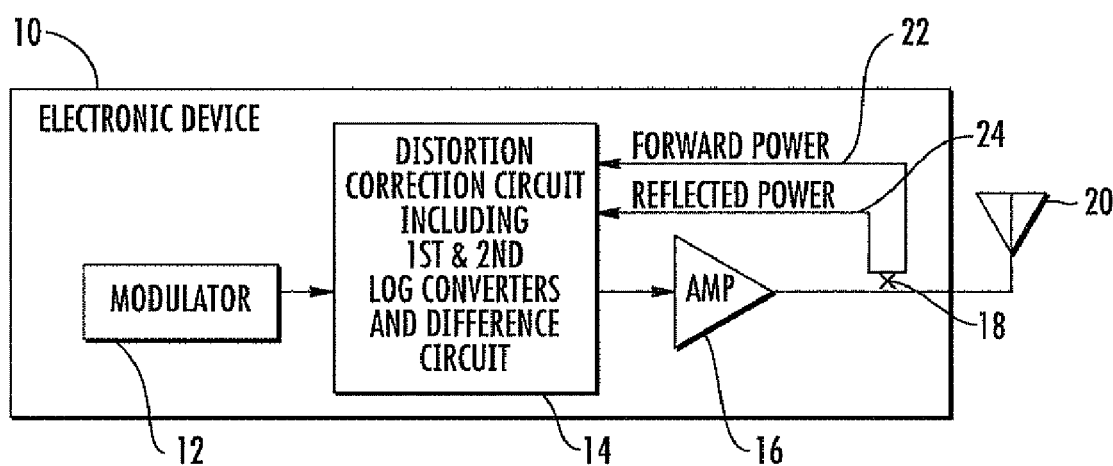
FIG. 1 is a block diagram of an electronic device with a distortion correction circuit including first and second logarithmic converters and a difference circuit in accordance with the present invention.

Referring initially to FIG. 1, the illustrated electronic device 10 includes an RF modulator 12 coupled to an input of a distortion correction circuit 14, and a power amplifier 16 is coupled to an output of the distortion correction circuit. A directional coupler 18 is downstream to the power amplifier 16, and an antenna 20 is downstream to the coupler. The electronic device 10 may be configured as an RF transmitter, for example. The directional coupler 18 provides feedback on the output signal from the power amplifier 16 to the distortion correction circuit 14. The feedback includes a sample of the forward power of the output signal over path 22, and a sample of the reflected power of the output signal over path 24. The reflected power is also referred to as the voltage standing wave ratio (VSWR).

Figure 2:
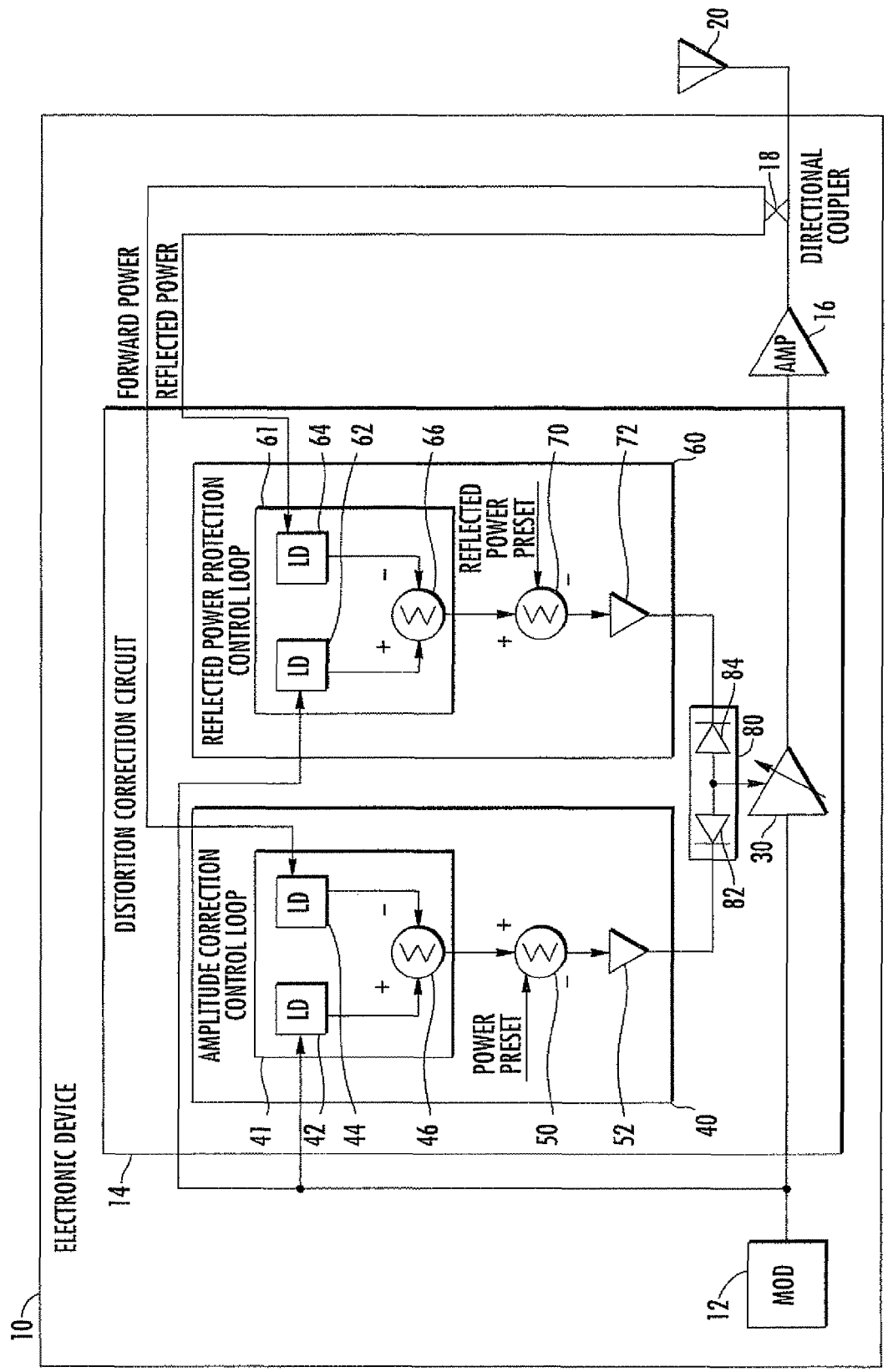
FIG. 2 is a more detailed block diagram of the distortion correction circuit including the first and second logarithmic converters and the difference circuit illustrated in FIG. 1.

A more detailed block diagram of the electronic device 10, including the distortion correction circuit 14, will now be discussed with additional reference to FIG. 2. The distortion correction circuit 14 is coupled between the RF modulator 12 and the power amplifier 16. The RF modulator 12 may also be referred to as a signal source since it provides the modulated signal that is to be amplified before being transmitted.

The distortion correction circuit 14 includes a variable gain amplifier 30 coupled between the RF modulator 12 and the power amplifier 16, and an amplitude correction control loop 40 is coupled to the variable gain amplifier. The amplitude correction control loop 40 includes a matched logarithmic device 41.

The matched logarithmic device 41 includes a first logarithmic converter 42 having an input coupled to an output of the RF modulator 12, a second logarithmic converter 44 having an input coupled to an output of the power amplifier 16, and a difference circuit 46 coupled to outputs of the first and second logarithmic converters. The output signal from the difference circuit 46 controls the gain of the variable gain amplifier 30 for correcting distortion in an output signal from the power amplifier 16. The illustrated difference circuit 46 is a difference junction.

The first and second logarithmic converters 42, 44 are preferably matched over an operating temperature range associated with the electronic device 10. The first and second logarithmic converters 42, 44 may advantageously correct non-linearity in the amplitude of the output signal from the power amplifier 16 such as without being dependent on the envelope of the output signal.

The first logarithmic converter 42 converts the output signal from the modulator 12 to a logarithmic signal. This output signal may be referred to as the reference signal since it is the modulated signal that is to be transmitted by the electronic device 10. The second logarithmic converter 44 converts the output signal from the power amplifier 16 to a logarithmic signal. This output signal may be referred to as the forward power feedback signal.

The log difference between the reference signal and the forward power feedback signal is offset by an offsetting circuit 50. The offsetting circuit 50 receives a power preset signal. The power preset signal corresponds to the desired power level of the output signal from the power amplifier 16. The illustrated offsetting circuit 50 is a difference junction.

The offset log difference from the offsetting circuit 50 is applied to an error integrator 52. The output of the error integrator 52 drives the exponentially responding variable gain amplifier 30. By varying the offset to the error integrator 52, a variable ratio is achieved between an instant amplitude of the output signal from the power amplifier 16 and that of the reference signal from the modulator 12. This may advantageously correct non-linearity in the amplitude of the output signal from the power amplifier 16 by removing the feedback gain dependence on the envelope of the output signal from the power amplifier 16. Consequently, a consistently high feedback gain may be maintained regardless of a value of the signal envelope while simultaneously achieving automatic transmit power level or gain control (TGC). Since the power amplifier 16 is allowed to operate in a more non-linear mode, it is more efficient, particularly in terms of power consumption and heat generation.

The distortion correction circuit 14 further includes a reflected power protection control loop 60 for protecting the power amplifier 16 under high VSWR conditions. The reflected power protection control loop 60 is selectively coupled to the variable gain amplifier 30 via a switch 80 when the VSWR is high for controlling the gain of the variable gain amplifier. An advantage of the reflected power protection control loop 60 is that under high VSWR conditions, this control loop pre-empts the amplitude correction control loop 40.

The reflected power protection control loop 60 includes a matched logarithmic device 61. The matched logarithmic device 61 includes a third logarithmic converter 62 having an input coupled to the RF modulator 12, a fourth logarithmic converter 64 having an input coupled to an output of the power amplifier 16, and a second difference circuit 66 coupled to outputs of the third and fourth logarithmic converters. The illustrated second difference circuit 66 is a difference junction.

The third and fourth logarithmic converters 62, 64 are also preferably matched over an operating temperature range associated with the electronic device 10. The third and fourth logarithmic converters 62, 64 may advantageously reduce a high VSWR in the output signal from the load without being dependent on the envelope of the output signal.

The third logarithmic converter 62 converts the output signal (i.e., reference signal) from the RF modulator 12 to a third logarithmic signal. The fourth logarithmic converter 64 converts the output signal from the power amplifier 16 to a fourth logarithmic signal. This output signal may be referred to as the reflected power feedback signal.

The log difference between the reference signal and the reflected power feedback signal is offset by a second offsetting circuit 70. The second offsetting circuit 70 receives a reflected power preset signal. The reflected power preset signal corresponds to the maximum allowed VSWR of the output signal from the power amplifier 16. The illustrated second offsetting circuit 70 is a difference junction.

The offset log difference from the second offsetting circuit 70 is applied to a second error integrator 72. The output of the second error integrator 72 drives the exponentially responding variable gain amplifier 30 based on a switching configuration of the switch 80. By varying the offset to the second error integrator 72, a variable ratio may be achieved between an instant amplitude of the output signal from the power amplifier 16 and that of the reference signal from the RF modulator 12.

The switch 80 is coupled between the amplitude correction control loop 40 and the reflected power protection control loop 60 for selecting one of the control loops for controlling the gain of the variable gain amplifier 30. In the illustrated embodiment, the switch 80 includes a pair of diodes 82, 84. This is one embodiment for a switch 80, wherein other types of switching configurations may be used, as readily appreciated by those skilled in the art. Under normal VSWR conditions, the switch 80 selects the amplitude correction control loop 40. Consequently, both VSWR protection and AM/AM correction may be achieved by the distortion correction circuit 14.

The first diode 82 has a cathode coupled to the amplitude correction control loop 40 for receiving an output signal from the error integrator 52, and has an anode. The second diode 84 has a cathode coupled to the reflected power protection control loop 60 for receiving an output signal from the second error integrator 72, and has an anode coupled to the anode of the first diode 82 and to the variable gain amplifier 30.

One of the control loops 40, 60 is selected when a corresponding first or second diode 80, 82 is forward biased. The first diode 82 is forward biased when a level of the output signal from the amplitude correction control loop 40 is lower than a level of the output signal from the reflected power protection control loop 60. Likewise, the second diode 82 is forward biased when a level of the output signal from the reflected power protection control loop 60 is lower than a level of the output signal from the amplitude correction control loop 40.

The RF modulator 12 is not limited to any particular type of modulation as will be appreciated by those skilled in the art. The modulation types include phase shift keying (PSK), quadrature phase shift keying (QPSK) and quadrature amplitude modulation (QAM), for example. Higher order modulation may also be used by the RF modulator 12. Higher order modulation involves a signal with more than 4 phase states and one amplitude state, such as QPSK or 4 PSK. Higher order modulations include but are not limited to 8 PSKR, 16 QAM, 64 QAM, 256 QAM, etc.

The electronic device 10 is not limited to any particular frequency band, and may operate at 3 MHz and above. For example, the electronic device 10 may be configured to operate within the HF band (3-30 MHz), the VHF band (30-300 MHz), the UHF band (300-3000 MHz) or in other bands above the UHF band.

The amplitude correction control loop 40 will now be discussed using equations to illustrate how the feedback gain dependence on the envelope of the output signal from the power amplifier 16 is removed, and as a result, high feedback gain is to be maintained regardless of a value of the signal envelope.

Log detectors 42, 44 are known for their very wide working dynamic range. This benefits a transmit gain control (TGC) loop in an electronic device 10, especially when used in combination with a dB linear (i.e., exponential) attenuator, such as a VGA 30.

Figure 3:
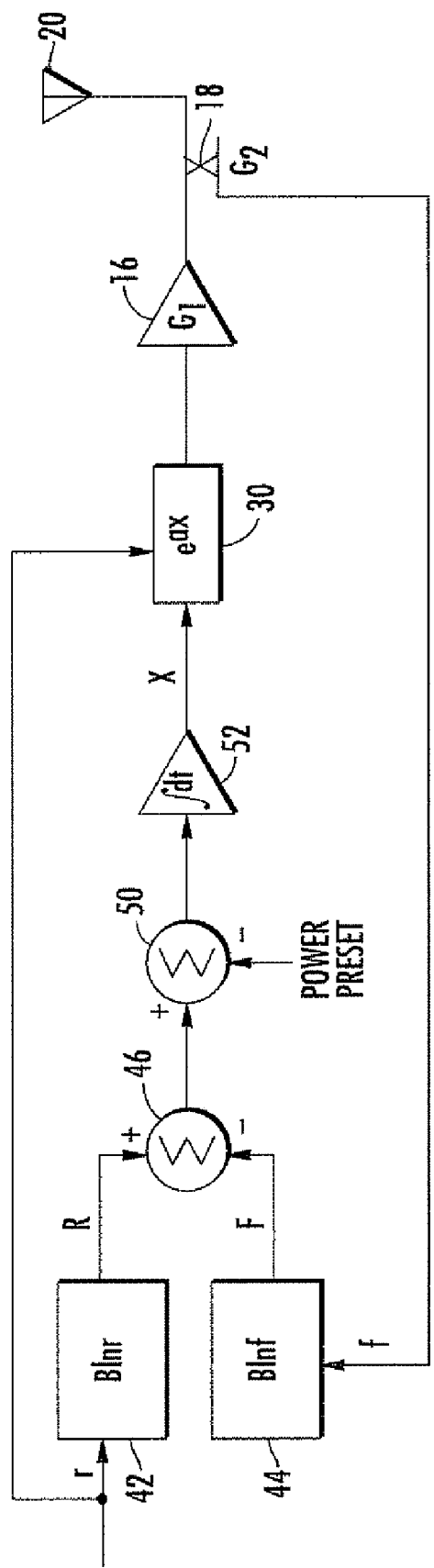
FIG. 3 is a block diagram illustrating a mathematical analysis of the amplitude correction control loop in accordance with the present invention.
Figure 5:
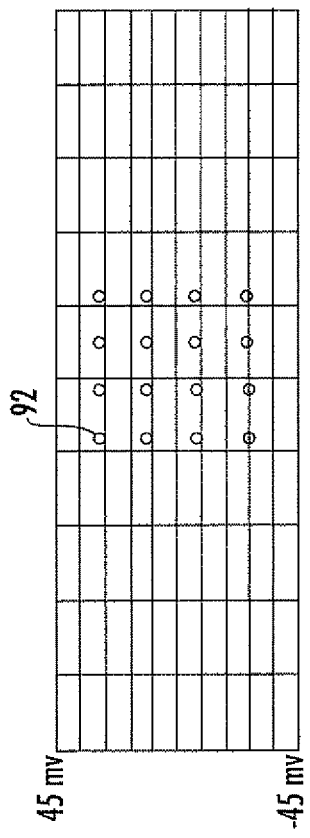
FIG. 5 is a constellation plot of the output signal from the power amplifier shown in FIG. 4 with distortion correction.

As illustrated in FIG. 3, the variable x is the output signal from the error integrator 52. The relation between the error integrator output x and the feedback signal F feeding the difference junction 46 is:

$$F=\beta \ln(e^{\alpha x}G)=\beta[\alpha x+\ln G] \quad (1)$$

where $\alpha$, $\beta$ are respective scaling coefficients of the exponential attenuator 30 and the log detectors 42, 44. The variable G is the total gain from the attenuator output to the log detector and is based on the product of the gain $G_1$ of the power amplifier gain 16, and the loss $G_2$ of the directional coupler 18, and any additional attenuation before the log detectors 42, 44.

The closed-loop gain excluding the integrator is:

$$\frac{\partial F}{\partial x} = \alpha\beta \quad (2)$$

which is a constant since it is a function of the product of the attenuator and detector scaling factors.

The fact that the closed-loop gain depends neither on amplifier chain gain nor the drive level has significant benefits that avoid issues traditional amplitude feedback loops face. One issue that is avoided is the closed-loop gain depending on attenuator drive level, caused by detector and attenuator non-linearity. While detectors can be reasonably linear with newer components over certain dynamic range, most attenuators are inherently non-linear.

Another issue that is avoided is the closed-loop gain depending on a reference signal envelope. This can be seen in the introduction of a multiplier in the feedback system, which varies the closed loop gain. As the reference envelope approaches zero, such as in the case of 100% amplitude modulation, the regulation of the integrator has no effect on the attenuator output. Overall, the loop gain is proportional to the instant reference signal envelope, which is highly undesirable for amplitude modulated signals. Yet another issue that is avoided is the closed-loop gain depending on the amplifier, directional coupler and other attenuator gain/loss.

With the above dependencies, the gain of the traditional envelop feedback correction loops becomes difficult to control. For example, it is only possible to achieve full bandwidth at the peak envelope. At lower envelope amplitudes, the feedback correction is significantly weakened.

A more intuitive way to see how the exponential attenuator and log detector combination apparently bypasses this "dead multiplier" issue is as follows. A certain voltage change $\Delta V$ at the control of the exponential attenuator results in a change at its output: $\alpha \Delta V$ in dBs. This will cause a voltage change at the log detector output $\alpha \beta \Delta V$ regardless of the RF gain between the attenuator and the detector.

It is also important to be concerned with the dynamics of the loop with all the drastically non-linear elements. It can be shown, through some algebraic manipulation, that the error amplifier input $\epsilon$ is completely described by the following differential equation, assuming unity error integrator gain:

$$\dot{\epsilon} + \alpha\beta\epsilon = -\beta(\ln \dot{G}) \quad (3)$$

This is a straightforward linear first order differential equation with constant coefficients. The error settles to zero with exponential decay and with a simple time constant $\alpha\beta$. It responds to the time derivative of the RF gain changes in dB. It is also worth noting that $\epsilon$ is the difference of the logs of RF signals. The errors being corrected are therefore in dB. RF signals approach their equilibrium exponentially if they are measured in dB, as readily appreciated by those skilled in the art.

Figure 4:
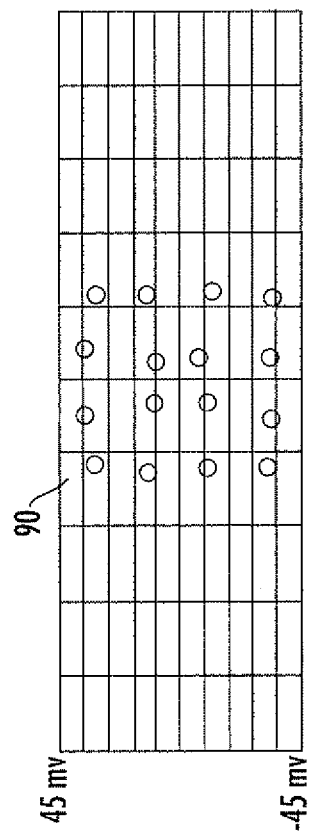
FIG. 4 is a constellation plot of an output signal from a power amplifier without distortion correction in accordance with the prior art.

A constellation plot of an output signal from the power amplifier 16 without distortion correction in illustrated in FIG. 4. The modulation is 16 QAM. The 16 dots 90 representing the modulated signal are elongated due to the power amplifier 16 operating in the non-linear regions. With application of the distortion correction circuit 14, the 16 dots 92 representing the modulated signal are now more defined. This is due to the power amplifier 16 being compensated.

Figure 7:
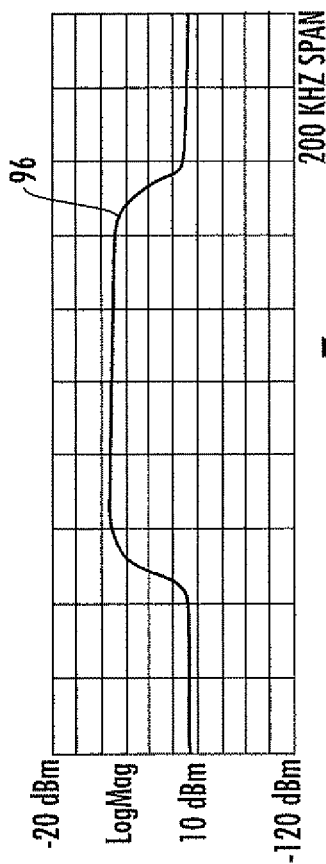
FIG. 7 is a spectrum plot of the output signal from the power amplifier shown in FIG. 6 with distortion correction.
Figure 6:
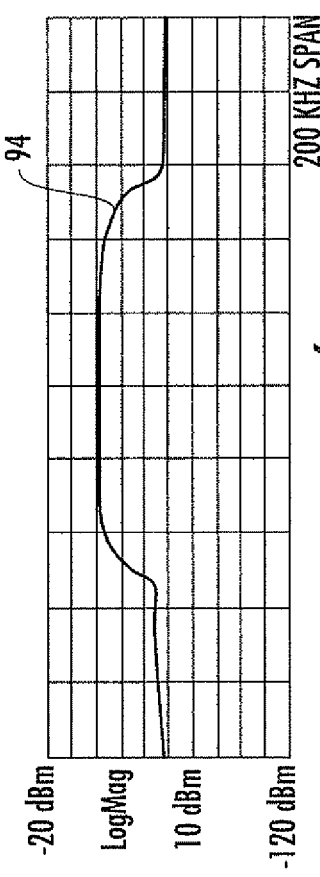
FIG. 6 is a spectrum plot of an output signal from a power amplifier without distortion correction in accordance with the prior art.
Figure 8:
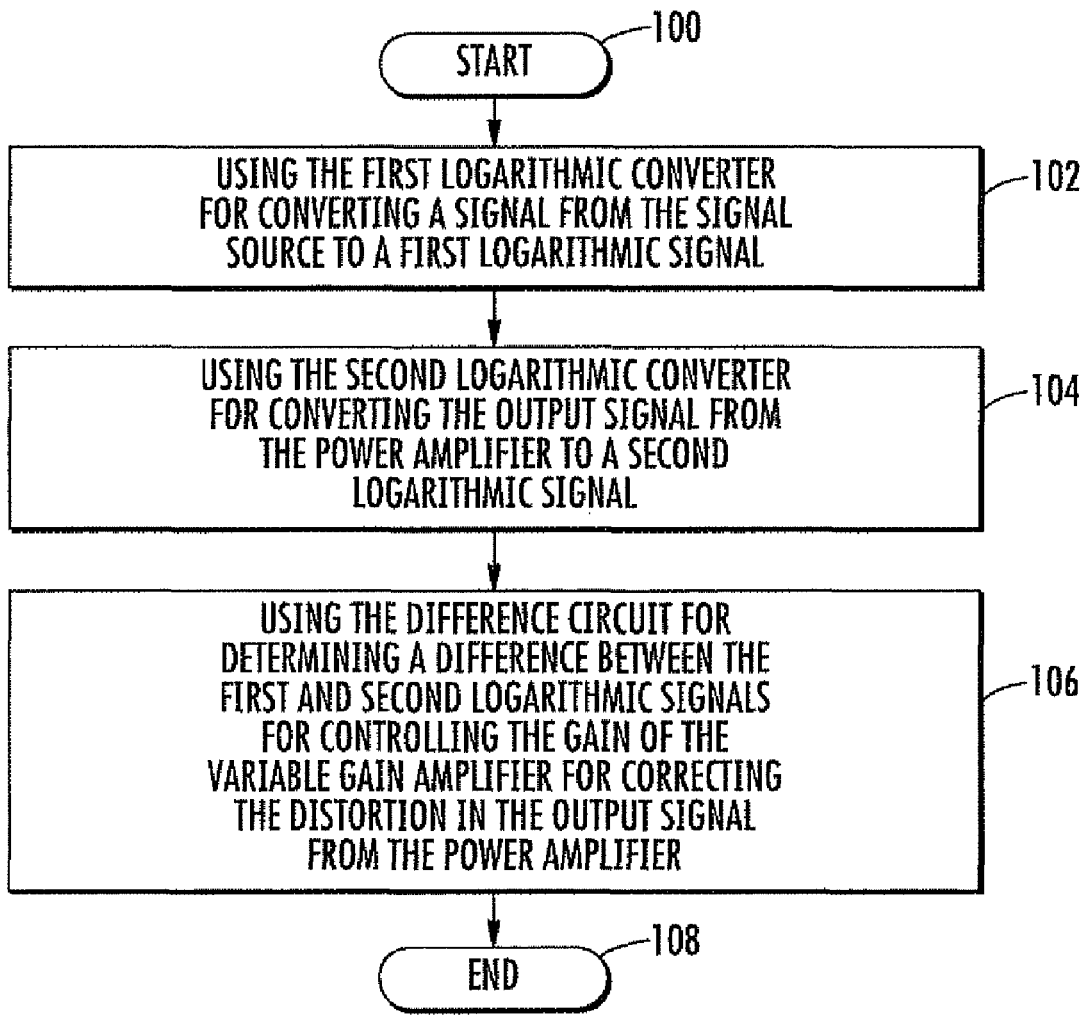
FIG. 8 is a flow chart illustrating a method for correcting distortion in an output signal from a power amplifier in accordance with the present invention.

A spectrum plot of the output signal without distortion correction is provided in FIG. 6 and a spectrum plot of the output signal with distortion correction is provided in FIG. 7. The level of out of channel signals in 94 without distortion correction is higher than that of the output signal 96 with distortion correction. The level difference is about 10 dB. This means that the transmitted signal outside of the allocated channel is reduced by a factor of 10.

Another aspect of the present invention is directed to a method for correcting distortion in an output signal from the power amplifier 16 using the distortion correction circuit 14 as discussed above. Starting from Block 100 the method comprises using the first logarithmic converter 42 for converting a signal from the signal source 12 to a first logarithmic signal at Block 102, and using the second logarithmic converter 44 for converting the output signal from the power amplifier 16 to a second logarithmic signal at Block 104. The difference circuit 46 is used for determining a difference between the first and second logarithmic signals for controlling the gain of the variable gain amplifier 30 for correcting the distortion in the output signal from the power amplifier 16 at Block 106. The method ends at Block 108.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
 a radio frequency (RF) modulator;
 a power amplifier; and
 a distortion correction circuit coupled between said RF modulator and said power amplifier, said distortion correction circuit comprising
  a variable gain amplifier coupled between said RF modulator and said power amplifier, and
  an amplitude correction control loop comprising
   a first logarithmic converter having an input coupled to said RF modulator,
   a second logarithmic converter having an input coupled to an output of said power amplifier, and
   a difference circuit coupled to outputs of said first and second logarithmic converters for controlling the gain of said variable gain amplifier for correcting distortion in an output signal from said power amplifier.

2. The electronic device according to claim 1 wherein said amplitude correction control loop further comprises an offsetting circuit coupled to an output of said difference circuit for offsetting an output signal therefrom based on a power preset signal.

3. The electronic device according to claim 2 wherein said amplitude correction control loop further comprises an integrator coupled to an output of said offsetting circuit for integrating an offset output signal therefrom, with the integrated offset output signal being used for controlling the gain of said variable gain amplifier.

4. The electronic device according to claim 1 wherein said distortion correction circuit further comprises a reflected power protection control loop comprising:
 a third logarithmic converter having an input to be coupled to the signal source;
 a fourth logarithmic converter having an input to be coupled to an output of the power amplifier; and
 a second difference circuit coupled to outputs of said third and fourth logarithmic converters for controlling the gain of said variable gain amplifier for reducing reflected power in the output signal from the load.

5. The electronic device according to claim 4 wherein said distortion correction circuit further comprises a switch coupled between said amplitude correction control loop and said reflected power protection control loop for selecting one of said control loops for controlling the gain of said variable gain amplifier.

6. The electronic device according to claim 5 wherein said switch comprises:
 a first diode having a cathode coupled to said amplitude correction control loop for receiving an output signal therefrom, and an anode; and
 a second diode having a cathode coupled to said reflected power protection control loop for receiving an output signal therefrom, and an anode coupled to the anode of said first diode and to said variable gain amplifier;

said first or second diode being forward biased for selecting said control loop associated therewith, with the selecting being based on respective levels of the output signals from said amplitude correction control loop and said reflected power protection control loop.

7. The electronic device according to claim 4 wherein said reflected power protection control loop further comprises a second offsetting circuit coupled to an output of said second difference circuit for offsetting an output signal therefrom based on a reflected power preset signal.

8. The electronic device according to claim 7 wherein said reflected power protection control loop further comprises a second integrator coupled to an output of said second offsetting circuit for integrating an offset output signal therefrom, with the integrated offset output signal being used for controlling the gain of said variable gain amplifier.

9. The electronic device according to claim 1 wherein said RF modulator operates based on quadrature amplitude modulation (QAM).

10. The electronic device according to claim 1 wherein the output signal from said power amplifier is within a frequency range of 3 MHz to 3 GHz.

11. A distortion correction circuit to be coupled between a signal source and a power amplifier of a radio frequency (RF) transmitter, the distortion correction circuit comprising:
    a variable gain amplifier to be coupled between the signal source and the power amplifier; and
    an amplitude correction control loop comprising
        a first logarithmic converter having an input to be coupled to the signal source,
        a second logarithmic converter having an input to be coupled to an output of the power amplifier, and
        a difference circuit coupled to outputs of said first and second logarithmic converters for controlling the gain of said variable gain amplifier for correcting distortion in an output signal from the power amplifier.

12. The distortion correction circuit according to claim 11 wherein said amplitude correction control loop further comprises:
    an offsetting circuit coupled to an output of said difference circuit for offsetting an output signal therefrom based on a power preset signal, with said offsetting circuit comprising a difference junction; and
    an error integrator coupled to an output of said offsetting circuit for integrating an offset output signal therefrom, with the integrated offset output signal being used for controlling the gain of said variable gain amplifier.

13. The distortion correction circuit according to claim 11 further comprising a reflected power protection control loop comprising:
    a third logarithmic converter having an input to be coupled to the signal source;
    a fourth logarithmic converter having an input to be coupled to an output of the power amplifier; and
    a second difference circuit coupled to outputs of said third and fourth logarithmic converters for controlling the gain of said variable gain amplifier for reducing reflected power in the output signal from the load.

14. The distortion correction circuit according to claim 13 further comprising a switch coupled between said amplitude correction control loop and said reflected power protection control loop for selecting one of said control loops for controlling the gain of said variable gain amplifier.

15. The distortion correction circuit according to claim 14 wherein said switch comprises:

a first diode having a cathode coupled to said amplitude correction control loop for receiving an output signal therefrom, and an anode; and a second diode having a cathode coupled to said reflected power protection control loop for receiving an output signal therefrom, and an anode coupled to the anode of said first diode and to said variable gain amplifier;

said first or second diode being forward biased for selecting said control loop associated therewith, with the selecting being based on respective levels of the output signals from said amplitude correction control loop and said reflected power protection control loop.

16. The distortion correction circuit according to claim 13 wherein said reflected power protection control loop further comprises:
    a second offsetting circuit coupled to an output of said second difference circuit for offsetting an output signal therefrom based on a reflected power preset signal, with said second offsetting circuit comprising a difference junction; and
    a second integrator coupled to an output of said second offsetting circuit for integrating an offset output signal therefrom, with the integrated offset output signal being used for controlling the gain of said variable gain amplifier.

17. The distortion correction circuit according to claim 11 wherein said first and second logarithmic converters are matched over an operating temperature range.

18. A method for correcting distortion in an output signal from a power amplifier of a radio frequency (RF) transmitter using a distortion correction circuit, the distortion correction circuit comprising a variable gain amplifier coupled between a signal source and the power amplifier, and an amplitude correction control loop comprising a first logarithmic converter having an input coupled to the signal source, a second logarithmic converter having an input coupled to an output of the power amplifier and a difference circuit coupled to outputs of the first and second logarithmic converters, the method comprising:
    using the first logarithmic converter for converting a signal from the signal source to a first logarithmic signal;
    using the second logarithmic converter for converting the output signal from the power amplifier to a second logarithmic signal; and
    using the difference circuit for determining a difference between the first and second logarithmic signals for controlling the gain of the variable gain amplifier for correcting the distortion in the output signal from the power amplifier.

19. The method according to claim 18 wherein the amplitude correction control loop further comprises an offsetting circuit coupled to an output of the difference circuit for offsetting an output signal therefrom based on a power preset signal; and an integrator coupled to an output of the offsetting circuit for integrating an offset output signal therefrom, with the integrated offset output signal being used for controlling the gain of the variable gain amplifier.

20. The method according to claim 18 wherein the distortion correction circuit further comprises a reflected power protection control loop comprising a third logarithmic converter having an input coupled to the signal source, a fourth logarithmic converter having an input coupled to an output of the power amplifier, and a second difference circuit coupled to outputs of the third and fourth logarithmic converters, the method further comprising:
    using the third logarithmic converter for converting a signal from the signal source to a third logarithmic signal;

using the fourth logarithmic converter for converting the output signal from the power amplifier to a fourth logarithmic signal; and using the second difference circuit for determining a difference between the third and fourth logarithmic signals for controlling the gain of the variable gain amplifier for reducing reflected power in the output signal from the load.

21. The method according to claim 20 wherein the distortion correction circuit further comprises a switch coupled between the amplitude correction control loop and the reflected power protection control loop for selecting one of the control loops for controlling the gain of the variable gain amplifier.

22. The method according to claim 21 wherein the switch comprises a first diode having a cathode coupled to the amplitude correction control loop for receiving an output signal therefrom, and an anode; and a second diode having a cathode coupled to the reflected power protection control loop for receiving an output signal therefrom, and an anode coupled to the anode of the first diode and to the variable gain amplifier, the method further comprising:

selecting one of the control loops when one of the first and second diodes is forward biased based on respective signal levels of the output signals from the amplitude correction control loop and the reflected power protection control loop; and said first or second diode being forward biased for selecting said control loop associated therewith, with the selecting being based on respective levels of the output signals from said amplitude correction control loop and said reflected power protection control loop.

23. The method according to claim 20 wherein the reflected power protection control loop further comprises a second offsetting circuit coupled to an output of the second difference circuit for offsetting an output signal therefrom based on a reflected power preset signal; and an integrator coupled to an output of the second offsetting circuit for integrating an offset output signal therefrom, with the integrated offset output signal being used for controlling the gain of the variable gain amplifier.

* * * * *